United States Patent
Bennett et al.

(10) Patent No.: US 7,562,182 B2
(45) Date of Patent: Jul. 14, 2009

(54) MEMORY ACCESS

(75) Inventors: Peter Bennett, Nailsea (GB); Andrew Dello, Minchinhampton (GB); Jonathan Smailes, Bridgwater (GB)

(73) Assignee: STMicroelectronics (R&D) Ltd., Buckinghamshire (GB)

( * ) Notice: Subject to any disclaimer, the term of this patent is extended or adjusted under 35 U.S.C. 154(b) by 445 days.

(21) Appl. No.: 11/592,735

(22) Filed: Nov. 3, 2006

(65) Prior Publication Data

US 2008/0209106 A1      Aug. 28, 2008

Related U.S. Application Data (63) Continuation of application No. 11/371,192, filed on Mar. 8, 2006, now abandoned, which is a continuation of application No. 11/186,389, filed on Jul. 21, 2005, now abandoned.

(51) Int. Cl.
    *G06F 12/00* (2006.01)
(52) U.S. Cl. ................................... 711/103
(58) Field of Classification Search ............... None
    See application file for complete search history.

(56) References Cited

U.S. PATENT DOCUMENTS

| | | | |
|---|---|---|---|
| 5,220,651 A * | 6/1993 | Larson | 710/8 |
| 6,175,896 B1 * | 1/2001 | Bui | 711/118 |
| 6,202,152 B1 * | 3/2001 | Yuenyongsgool et al. | 713/189 |
| 6,263,399 B1 | 7/2001 | Hwang | |
| 6,279,083 B1 | 8/2001 | MacDonald | |
| 2002/0114211 A1 | 8/2002 | Charlier et al. | |
| 2003/0174543 A1 | 9/2003 | Nagai et al. | |
| 2004/0003168 A1 | 1/2004 | Kim et al. | |
| 2004/0225787 A1 * | 11/2004 | Ma et al. | 710/260 |

OTHER PUBLICATIONS

European Search Report from European Patent Application No. 04254362.9, filed Jul. 21, 2004.

* cited by examiner

*Primary Examiner*—Hiep T Nguyen
(74) *Attorney, Agent, or Firm*—Lisa K. Jorgenson; James H. Morris; Wolf, Greenfield & Sacks, P.C.

(57) ABSTRACT

A memory access system including a memory in which data is organized in pages, each page holding a sequence of data elements; means for receiving a requested address including a requested page address and a requested data element address; logic for accessing a current page from the memory using a current page address; logic for reading out data elements of the current page in the sequence in which they are held in memory; logic for comparing the requested page address with the current page address and for issuing a memory access request with the requested page address when they are not the same; and logic operable when the requested page address is the same as the current page address for comparing a requested data element address with the current address of a data element being read out and returning the data element when the requested data element address matches the current data element address.

17 Claims, 4 Drawing Sheets

MEMORY ACCESS

CROSS REFERENCE TO RELATED APPLICATIONS

This application is a continuation of U.S. application Ser. No. 11/371,192, filed Mar. 8, 2006, which in turn is a continuation of U.S. application Ser. No. 11/186,389, filed Jul. 21, 2005 entitled Memory Access, which application is incorporated herein by reference in its entirety.

BACKGROUND OF THE INVENTION

1. Field of the Invention

The present invention relates to a method and system for accessing a memory, particularly but not exclusively for directly accessing code for a CPU during booting.

2. Discussion of the Related Art

Figure 1:
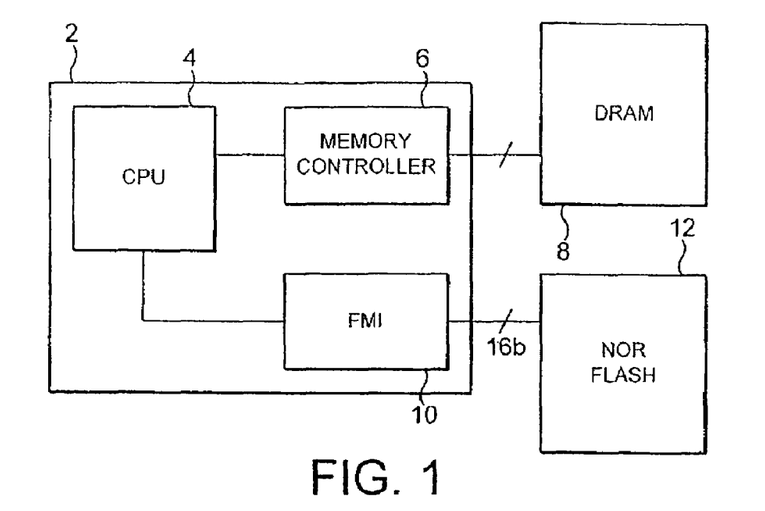
FIG. 1 is a schematic block diagram of a direct interface boot system using NOR flash.

FIG. 1 is a schematic block diagram of a computer system with a direct interface boot arrangement using NOR flash. An integrated circuit 2 has a CPU 4 which is connected via a memory controller 6 to a DRAM 8 for normal operation of the system. In addition, the CPU 4 is connected via a flash memory interface (FMI) 10 to a NOR flash memory 12. The NOR flash memory 12 holds boot code and operating system code which are used by the CPU for its boot procedure. As a NOR flash memory can be accessed randomly at reasonable speed, the CPU can boot itself directly via the FMI 10 by fetching instructions from the NOR flash memory 12. After booting, subsequent operations are carried out using the DRAM 8.

One of the advantages of providing NOR flash memory to hold boot code is that it is directly interfaceable with the CPU and can be randomly accessed. However, NOR flash memory suffers from disadvantages relative to NAND flash memory in a number of respects. It will be appreciated that the term NOR flash memory relates to a flash memory where the memory cell structure has a NOR structure, such that the memory cells are connected to the bit lines in parallel so that if any memory cell is turned on by the corresponding word line, the bit line goes low. As the logic function is similar to a NOR gate, this cell arrangement is referred to as NOR flash. NAND flash uses a number of transistors in series and the unit cell has a smaller cell area than for NOR flash. Moreover, the erasing and programming times for NAND flash are significantly shorter than for NOR flash. For example, the programming time for NOR flash is typically more than an order of magnitude greater than for NAND flash. Moreover, NAND flash is cheaper and, because of the smaller cell area, has a much higher density.

Figure 2:
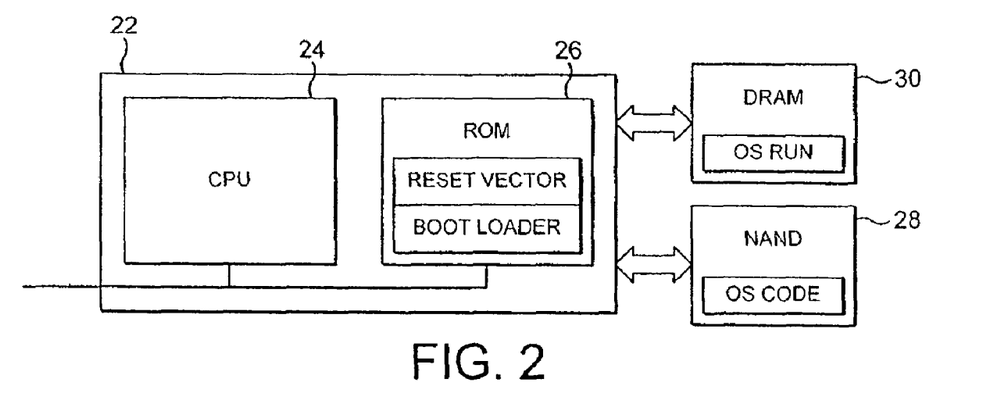
FIG. 2 is a schematic block diagram of a system using NAND flash to store boot code, which utilizes code shadowing.

The disadvantage of using NAND flash to hold boot code is that it is not randomly accessible. NAND flash memory has no dedicated address lines. It is controlled using an indirect input/output like interface through which commands and addresses are sent via an 8-bit bus to an internal command and address register. The result is that entire pages (or page segments) are read out at once, with bytes in a page only being available in the sequence in which they are stored in the memory. One way of using NAND flash memory for booting is illustrated in FIG. 2. FIG. 2 shows a chip 22 with a CPU 24 and a small embedded ROM 26. The embedded ROM holds a reset vector and boot loader code. The operating system code is held in a NAND flash memory 28 connected to the chip 22. After the boot loader code has been executed by the CPU, the operating system code is downloaded from the NAND flash memory 28 into a DRAM 30 which is also connected to the chip 22. The download is of course on a page-by-page basis, due to the read restriction of the NAND flash memory. Once the operating system code has been downloaded from the NAND flash 28 into the DRAM 30, it can be executed by the CPU in the normal way. This "duplication" of the operating system code prior to execution is termed "code shadowing".

It would be advantageous to be able to make use of the advantages of NAND flash for holding boot code without the need for code shadowing when the boot code is to be executed.

SUMMARY OF THE INVENTION

According to one aspect of the invention there is provided a memory access system comprising: a memory in which data is organized in pages, each page holding a sequence of data elements; means for receiving a requested address comprising a requested page address and a requested data element address; means for accessing a current page from the memory using a current page address; means for reading out data elements of the current page in the sequence in which they are held in memory; means for comparing the requested page address with the current page address and for issuing a memory access request with the requested page address when they are not the same; and means operable when the requested page address is the same as the current page address for comparing a requested data element address with the current address of a data element being read out and returning the data element when the requested data element address matches the current data element address.

Another aspect provides a method of accessing a memory in which data is organized in pages, each page holding a sequence of data elements, the method comprising: receiving a requested address comprising a requested page address and a requested data element address from a requester; comparing the requested page address with a current page address of a page which is being accessed from the memory and, when the requested page address is not the same as the current page address, issuing a memory access request using the requested page address; reading out data elements of the current page in the sequence in which they are held in memory; and comparing a requested data element address with the current address of a data element being read out and returning to the requester the data element when the requested data element address matches the current data element address.

Another aspect of the invention provides an integrated circuit comprising: means for receiving a requested address for accessing a memory in which data is organized in pages, each page holding a sequence of data elements, the requested address comprising a requested page address and a requested data element address; means for accessing a current page from the memory using a current page address; means for receiving data elements of a current page in the sequence in which they are held in the memory; means for comparing the requested page address with the current page address and for issuing a memory access request with the requested page address when they are not the same; and means operable when the requested page address is the same as the current page address for comparing a requested data element address with the current address of a data element being read out and returning the data element when the requested data element address matches the current data element address.

The integrated circuit can form part of a memory access system by being connected to a memory such as a NAND flash memory.

In the described embodiment, the data elements are bytes, but it will be appreciated that any size data element could be used with the present invention. The invention is particularly useful where the memory is a NAND flash memory of an existing type, which is subject to the read restrictions which have been described above. In that case, the invention allows the read capabilities of the NAND flash memory to be optimised by only performing a random access to the memory when it is necessary.

BRIEF DESCRIPTION OF THE DRAWINGS

For a better understanding of the present invention and to show how the same may be carried into effect, reference will now be made by way of example to the accompanying drawings, in which.

DETAILED DESCRIPTION

Figure 3:
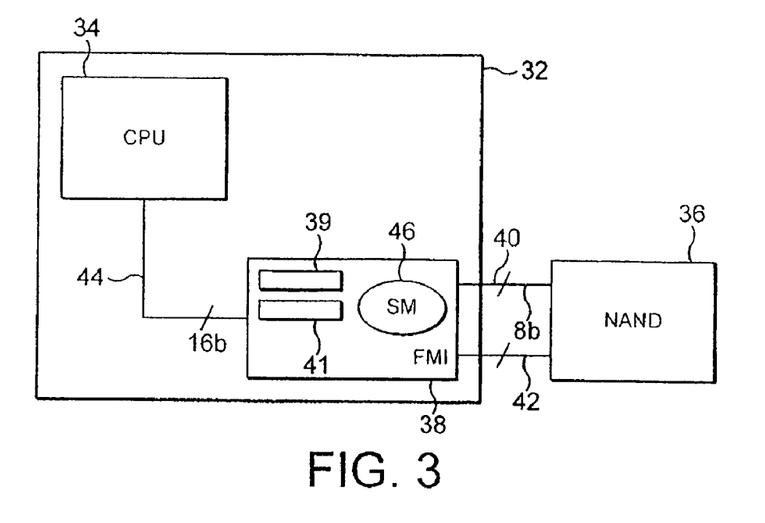
FIG. 3 is a schematic block diagram of one embodiment of the invention.

Reference will now be made to FIG. 3 to illustrate the principles of one embodiment of the invention. A chip 32 has a CPU 34 which communicates with a NAND flash memory 36 via a flash memory interface 38. The flash memory interface is connected to the NAND flash memory 36 via an 8-bit bus 40. The flash memory interface 38 also provides control signals to the NAND flash 36 over control bus 42.

The flash memory interface 38 receives a 16-bit address from the CPU over a system bus 44. The system bus 44 also connects a CPU to other external memory, for example an DRAM as illustrated in FIG. 1, though these are not shown in FIG. 3.

The flash memory interface 38 comprises a state machine 46 and address registers 39, 41. A discussion of the operation of the flash memory interface 38 is given later. The NAND flash memory 36 holds boot code and compressed operating system code which is directly executable by the CPU 34 via the FMI 38.

Figure 4:
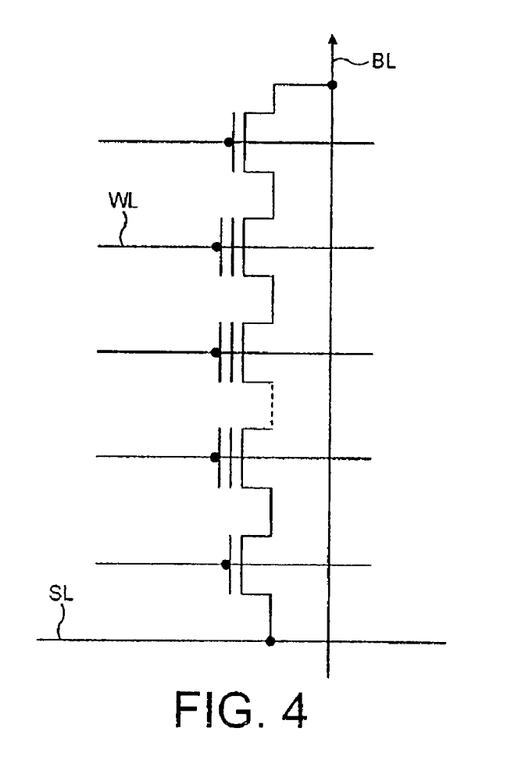
FIG. 4 is a transistor diagram of a unit cell in a NAND flash memory.

For the sake of completeness and although it is known in the art, FIG. 4 illustrates one possible cell layout of a memory cell of a NAND flash, illustrating the bit line BL, word line WL and source line SL. This will not be discussed in more detail because it is known to a person skilled in the art.

Figure 5:
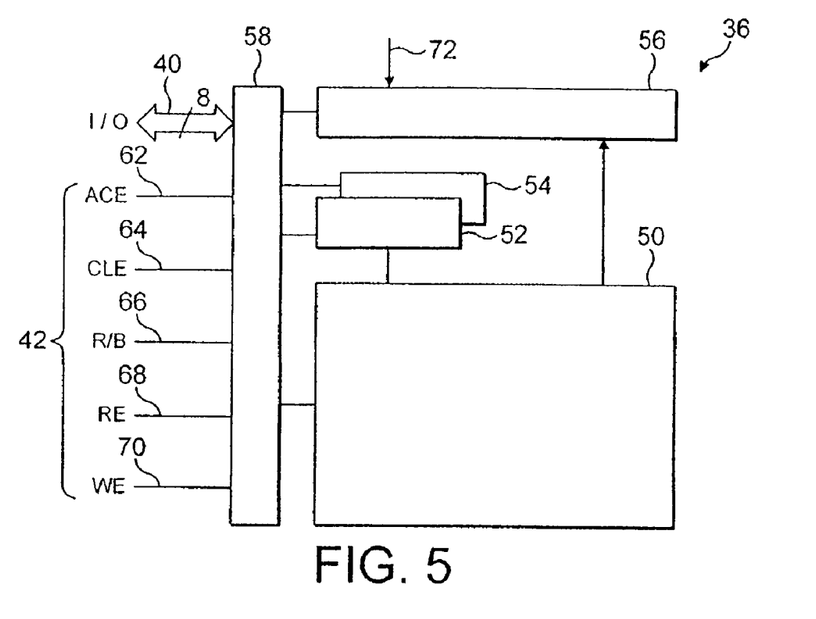
FIG. 5 is a schematic diagram of registers in a NAND flash memory.

FIG. 5 is a schematic diagram of the internal registers of the NAND flash memory 36. The registers include a command register 52, an address register 54 and a data register 56. The NAND flash memory also includes a memory array 50 which holds data as pages, for example 512 bytes long. An interface 58 receives 8-bit addresses along the I/O bus 40 and the following control signals over control bus 42:

Address Latch Enable (ALE) 62
Command Latch Enable (CLE) 64
Ready/Busy (R/B) 66
Read Enable (RE) 68
Write Enable (WE) 70.

The I/O bus 40 also serves the function of transferring data output from the NAND flash memory 36 to the FMI 38.

Figure 6:
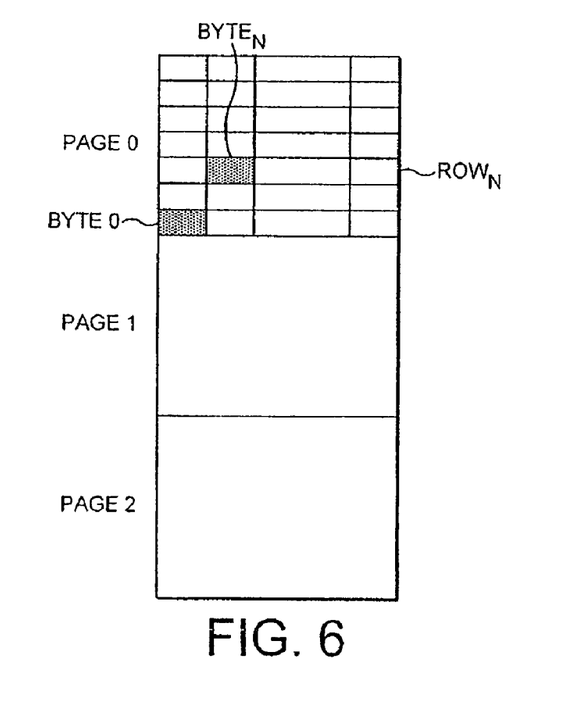
FIG. 6 is a diagram of page/byte storage in a NAND flash.

FIG. 6 illustrates how the data is stored in the NAND flash memory 36. That is, there is a plurality of pages, page 0, page 1 etc., each page holding a plurality of bytes, for example 512 bytes. Byte$_0$ is labelled as the first byte in a page, and Byte$_N$ is illustrated as a requested byte in a page. The bytes are organized in rows, for example aligned on 32 byte boundaries so that each row comprises a group of 32 bytes: ROW$_N$ included Byte$_N$.

A typical read sequence for the NAND flash memory 36 will now be described. A read command is written to the command register 52, and a page address (8$b$) is written to the address register 54. Individual rows/bytes within a page cannot be addressed in a conventional NAND flash memory. The device puts a page of data into the data register 56 and this is read out, byte-by-byte the bytes being read out in the sequence in which they are stored in the page, beginning at the first byte, Byte$_0$. In the sequential read mode, once a page of data has been read out of the data register 56, the next page is loaded in and is ready to be read out. An output data pointer 72 associated with the data register 56 keeps track of which byte is currently being read out.

Figure 7:
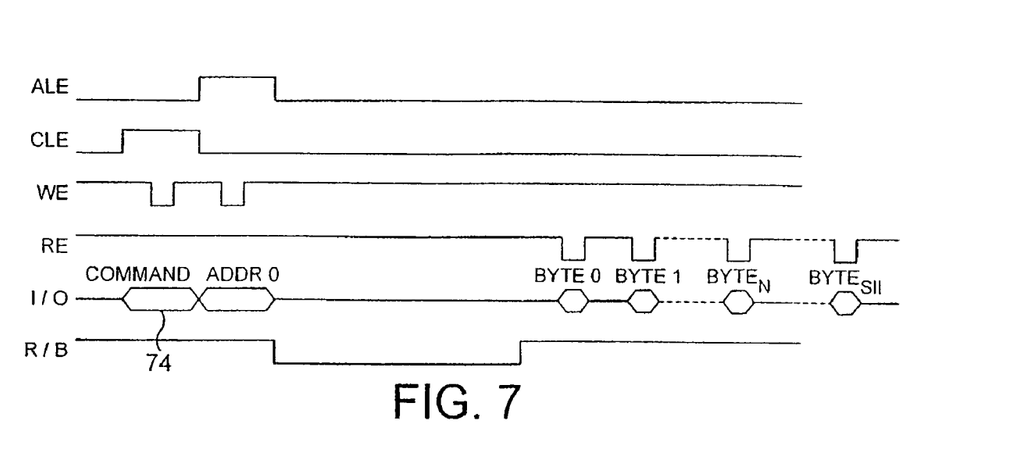
FIG. 7 is a timing diagram illustrating how the NAND flash is read.

A page read operation will now be described in more detail with reference to the timing diagram of FIG. 7. It will be noted in the following that a single read mode is described where a whole page is accessed for each read address. In fact, normally there will be two or three read modes for accessing different halves/thirds of the page.

Command Phase

A command byte 74 is place on the I/O bus 40 with ALE equal to zero and CLE equal to one. The write enable signal WE is brought low then high and this stores the read mode command into the command register 52.

Address Phase

The address byte Addr0 is placed onto the input/output bus 40 with CLE equal to zero and ALE equal to one. The write enable signal WE is toggled again to load the address into the address register 54.

Data Transfer Phase

With CLE equal to zero and ALE equal to zero, the chip goes busy in preparation for data readout. During the busy period, the ready/busy signal 66 goes low for up to 25 ms while data is being read from the memory array 50 and transferred into the data register 56. A complete page of data is transferred into the data register 56.

Readout Phase

When the R/B signal 66 goes high again, data is available in the data register for readout. Bytes are read out under the control of the read enable pulses. The first data byte to be output is Byte$_0$, and each RE pulse reads out the next byte in the register (which is the next byte in sequence as stored in the page).

Figure 8:
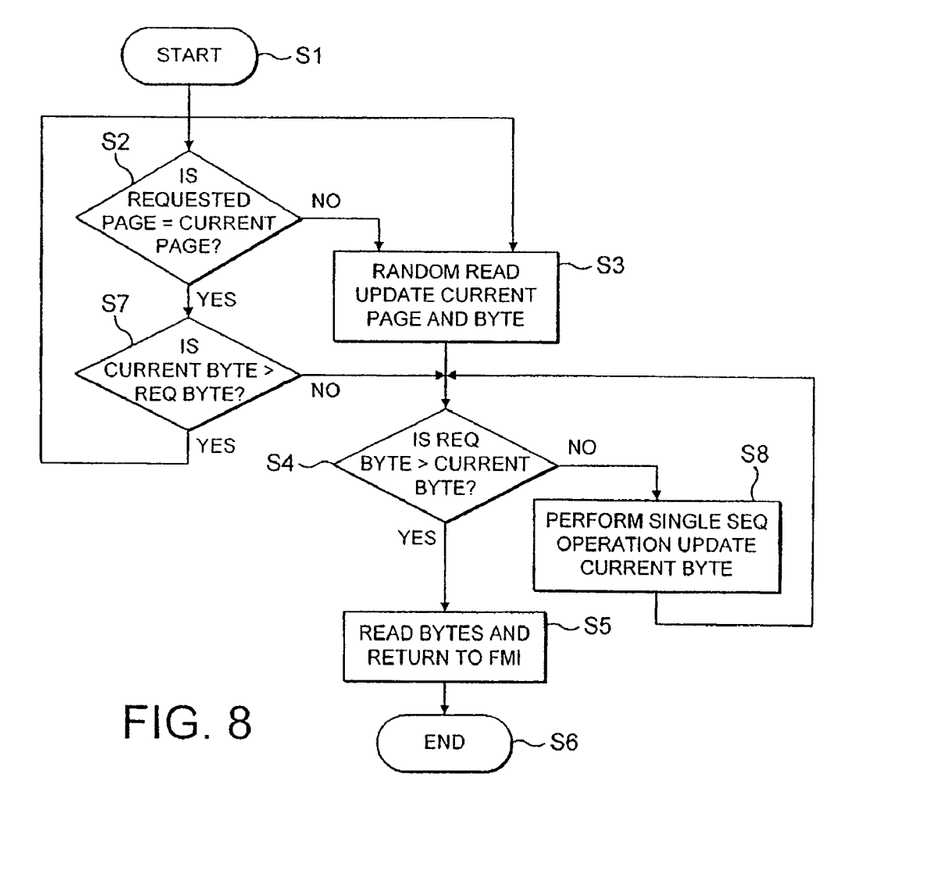
FIG. 8 is a flow diagram of a state machine for use in the embodiment of FIG. 3.

FIG. 8 illustrates a flow chart for the state machine 46 which receives 16-bit random addresses from the CPU 34 and supplies these to the NAND flash 36 in dependence on the protocol to be described to make maximum use of the NAND flash readout facility described above. Each 16-bit address provides an 8-bit page address and an 8-bit byte address. These are referred to herein as the requested page and requested byte. It will be appreciated that in normal operation of the CPU, a group of bytes, for example a row, is normally required. In that case, the 16-bit address supplied by the CPU constitutes the address of the first byte, and the system realizes that it needs to supply the next group of sequential bytes to complete the access which has been requested by the CPU.

When an address is received from the CPU 34, it is held in requested address register 39 and the state machine 46 starts at step S1. The address of a current access being made to the NAND flash 36 is held in the current address register 41. The page address in the address which has been received from the CPU 34 is read and is compared with the current page that is being accessed from the NAND flash memory 36 at step S2. If the requested page is not the same as the current page, then a decision is made to generate a random read to the NAND flash memory 36 by providing the requested page address over I/O bus 40 (step S3). The page address in the current address register 41 is updated to reflect the new requested page address. The byte address in the current register 41 is updated to read byte zero (or the first byte in the segment of the page which is being addressed when the NAND flash memory is being operated in different read modes). The read operation described above is then completed and data for the addressed page is placed in the data register 56 to be read out byte-by-byte under the control of RE pulses 68. As each byte is read out, the byte address is updated in the current register 41. Also, at step S4, the current byte address is compared with the requested byte address held in the requested address register 39. When the current byte address is the same as the requested byte address, this indicates that the group of bytes beginning at that current byte address is the group which has been requested by the CPU. In the present embodiment, this is a row of 32 bytes. Therefore, the RE line 68 is pulsed 32 times to return the next 32 bytes to FMI (step S5). These bytes are Collected and given to the fetch unit of the CPU via the bus 44. The sequence then ends at step S6.

When the current byte address is not the same as the requested byte address, the state machine continues to read out bytes from the NAND flash 36 and to update the current byte until the determination at step S4 reaches a positive conclusion.

Returning to step S2, if when the requested page is compared with the current page it is determined that they are the same, then it is necessary to establish whether the requested byte has already been read out of the data register 56 or not (step S7). If the current byte is later in the page than the requested byte, such that the requested byte has already been read out, then it is necessary to return to step S3 and perform a random read for the same page so that it can begin reading out again at the first byte until it reaches the requested byte. If however the current byte is earlier in sequence than the requested byte, then all that is needed is to carry on reading bytes out of the data register 56 until at step S4 the requested byte is found to match the current byte.

While one embodiment of the invention has been described above, it will be clear to a person skilled in the art that there are many variations within the scope of the invention. For example, most existing NAND flash memories operate with different read modes for reading out different segments of the page, because the whole page is too big to be held in the data register 56. The invention is equally applicable to these situations, the only change being that when a new random read is generated, the read mode is supplied with the page address.

In addition, the embodiment which has been described has a group (row) of bytes requested by the CPU for each access. It will be clear that the group of bytes requested by the CPU could be any number from one upwards.

It can be seen that in the above implementation there is no need for a random access memory In the interface which represents a useful advantage, though it will be appreciated that the invention could be implemented with a small cache RAM in the interface if desired.

Current address register and requested address register have been described as part of the flash memory interface, but it will be apparent that these registers could be located at any suitable place in the system.

The above-described embodiment of the invention allows the benefits of NAND flash memory to be utilised, particularly during booting. A random access to the NAND flash memory may take about 20 ms, which is much slower than for NOR flash or other equivalent non-volatile memory. However, sequential access of bytes using the read enable signal is about 240 times faster than that, so to the extent that the state machine can establish whether a random access is really needed, a significant time saving can be made. Thus, the invention optimises the use of random access and serial byte access therefore making the best use of the NAND flash memory read capability.

It will be appreciated that while the figures illustrate a chip 32 having an external boundary communicating with a NAND flash memory 36, the NAND flash memory could form part of the chip 32 and the principles of the invention could still be applied. Therefore the invention contemplates an integrated circuit having the elements required to communicate with an off-chip memory, or an integrated circuit which incorporates the memory itself.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory access system comprising:
   a memory in which data is organized in pages, each page holding a sequence of data elements;
   means for receiving a requested address comprising a requested page address and a requested data element address;
   means for accessing a current page from the memory using a current page address;
   means for reading out data elements of the current page in the sequence in which they are held in memory;
   means for comparing the requested page address with the current page address and for issuing a memory access request with the requested page address when they are not the same; and
   means operable when the requested page address is the same as the current page address for comparing a requested data element address with the current address of a data element being read out and returning the data element when the requested data element address matches the current data element address.

2. A memory access system according to claim 1, wherein the memory comprises a NAND flash memory.

3. A memory access system according to claim 1, wherein each data element comprises a byte.

4. A memory access system according to claim 1, wherein a group of data elements is returned beginning at the data element at the current address when the requested data element address matches the current data element address.

5. A memory access system according to claim 4, wherein the group comprises a row of data elements.

6. A memory access system according to claim 1, wherein the reading means comprises means for generating a sequence of read pulses, one data element being read out at each read pulse.

7. A memory access system according to claim 1, wherein the memory comprises a data array holding the data organized in pages, an address register for holding the requested address and a data output register for holding data elements in preparation to be read out by the reading means.

8. A method of accessing a memory in which data is organized in pages, each page holding a sequence of data elements, the method comprising:
   receiving a requested address comprising a requested page address and a requested data element address from a requestor;
   comparing the requested page address with a current page address of a page which is being accessed from the memory and, when the requested page address is not the same as the current page address, issuing a memory access request using the requested page address;
   reading out data elements of the current page in the sequence in which they are held in memory; and
   comparing a requested data element address with the current address of a data element being read out and returning to the requestor the data element when the requested data element address matches the current data element address.

9. A method according to claim 8, wherein the requester is a CPU.

10. A method according to claim 8, wherein the step of returning the data element comprises returning a group of data elements commencing at the data element for which the current data element address matches the requested data element address.

11. A method according to claim 8, wherein the step of reading out data elements comprises generating a sequence of read enable pulses, one data element being read out at each pulse.

12. A method according to claim 8, wherein a data element is a byte.

13. A method according to claim 8, wherein the memory is a NAND flash memory.

14. A method according to claim 8, when used to access boot code for booting a computer system.

15. An integrated circuit comprising a memory access system according to claim 1.

16. An integrated circuit comprising:
   means for receiving a requested address for accessing a memory in which data is organized in pages, each page holding a sequence of data elements, the requested address comprising a requested page address and a requested data element address;
   means for accessing a current page from the memory using a current page address;
   means for receiving data elements of a current page in the sequence in which they are held in the memory;
   means for comparing the requested page address with the current page address and for issuing a memory access request with the requested page address when they are not the same; and
   means operable when the requested page address is the same as the current page address for comparing a requested data element address with the current address of a data element being read out and returning the data element when the requested data element address matches the current data element address.

17. A memory access system comprising an integrated circuit according to claim 16 and a memory in which data is organized in pages, each page holding a sequence of data elements.

* * * * *

UNITED STATES PATENT AND TRADEMARK OFFICE
CERTIFICATE OF CORRECTION

| | |
|---|---|
| PATENT NO. | : 7,562,182 B2 |
| APPLICATION NO. | : 11/592735 |
| DATED | : July 14, 2009 |
| INVENTOR(S) | : Peter Bennett et al. |

It is certified that error appears in the above-identified patent and that said Letters Patent is hereby corrected as shown below:

Col. 2, line 34 should read:
requested data element address from a requestor; comparing line 42, should read:
of a data element being read out and returning to the requestor Signed and Sealed this Eighteenth Day of August, 2009

David J. Kappos
*Director of the United States Patent and Trademark Office*

UNITED STATES PATENT AND TRADEMARK OFFICE
CERTIFICATE OF CORRECTION

PATENT NO. : 7,562,182 B2
APPLICATION NO. : 11/592735
DATED : July 14, 2009
INVENTOR(S) : Bennett et al.

Page 1 of 1

It is certified that error appears in the above-identified patent and that said Letters Patent is hereby corrected as shown below:

On the title page, item [30] should read:
item [30]    Foreign Application Priority Data
Jul. 21, 2004    EP .................. 04254362.9

Signed and Sealed this
Twenty-sixth Day of November, 2013

Margaret A. Focarino
*Commissioner for Patents of the United States Patent and Trademark Office*